(12) United States Patent
Hong

(10) Patent No.: US 8,421,342 B2
(45) Date of Patent: Apr. 16, 2013

(54) ORGANIC LIGHT-EMITTING DISPLAY DEVICE

(75) Inventor: Sang-Min Hong, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 229 days.

(21) Appl. No.: 12/929,999

(22) Filed: Mar. 1, 2011

(65) Prior Publication Data
US 2011/0215712 A1    Sep. 8, 2011

(30) Foreign Application Priority Data

Mar. 5, 2010    (KR) .................. 10-2010-0020059

(51) Int. Cl.
*H05B 33/00*    (2006.01)
(52) U.S. Cl.
USPC .......................................... 313/504; 313/503
(58) Field of Classification Search .................. None
See application file for complete search history.

(56) References Cited

U.S. PATENT DOCUMENTS

| | | | | |
|---|---|---|---|---|
| 6,798,132 B2* | 9/2004 | Satake | ............. | 313/495 |
| 7,109,655 B2* | 9/2006 | Kurihara | ............. | 313/512 |
| 7,402,948 B2* | 7/2008 | Yamazaki et al. | ............. | 313/506 |
| 2003/0067266 A1 | 4/2003 | Kim et al. | | |
| 2006/0060850 A1 | 3/2006 | Kwak et al. | | |
| 2006/0097628 A1* | 5/2006 | Suh et al. | ............. | 313/504 |
| 2006/0097632 A1 | 5/2006 | Ryu | | |
| 2006/0199601 A1 | 9/2006 | Cho | | |
| 2010/0134734 A1 | 6/2010 | Kim et al. | | |
| 2010/0231124 A1* | 9/2010 | Song | ............. | 313/504 |

FOREIGN PATENT DOCUMENTS

| | | |
|---|---|---|
| KR | 10 2003-0037451 A | 5/2003 |
| KR | 10 2005-0042523 A | 5/2005 |
| KR | 10 2005-0072310 A | 7/2005 |
| KR | 10 2005-0113517 A | 12/2005 |
| KR | 10 2006-0040453 A | 5/2006 |
| KR | 10 2006-0098596 A | 9/2006 |
| KR | 10 2007-0051603 A | 5/2007 |
| KR | 10 2007-0051619 A | 5/2007 |
| KR | 10 2009-0058156 A | 6/2009 |

* cited by examiner

*Primary Examiner* — Ashok Patel
(74) *Attorney, Agent, or Firm* — Lee & Morse, P.C.

(57) ABSTRACT

An organic light-emitting display device includes a substrate, a plurality of thin film transistors disposed on a first surface of the substrate, a passivation layer covering the plurality of thin film transistors, a plurality of first pixel electrodes disposed on the passivation layer, the first pixel electrodes overlapping the plurality of thin film transistors, each of the first pixel electrodes including a reflection layer formed of a conductive material that reflects light, a plurality of second pixel electrodes disposed on the passivation layer, the second pixel electrodes being connected to the first pixel electrodes respectively, the second pixel electrodes being formed of a conductive material that transmits light, an opposite electrode, the opposite electrode both allowing light to pass therethrough and reflecting light, the opposite electrode facing the first and second pixel electrodes, and an organic layer disposed among the first and second pixel electrodes and the opposite electrode.

17 Claims, 9 Drawing Sheets

ORGANIC LIGHT-EMITTING DISPLAY DEVICE

BACKGROUND

1. Field

Embodiments relate to an organic light-emitting display device.

2. Description of the Related Art

Applications of organic light-emitting display devices range from personal portable devices, such as MP3 players and mobile phones, to television sets, owing to having superior characteristics, such as wide viewing angles, high contrast ratios, short response times, and low amounts of power consumption.

An organic light-emitting display device has self-light emitting characteristics, and the weight and thickness of the organic light-emitting display device may be reduced since the organic light-emitting display device does not require an additional light source, unlike a liquid crystal display device.

Also, an organic light-emitting display device may be formed to be a transparent display device by having transparent thin film transistors and transparent organic light-emitting devices.

SUMMARY

It is a feature of an embodiment to provide an organic light-emitting display device that is formed to be transparent by improving the transmittance of a transmitting region thereof, and in which a high outcoupling efficiency can be achieved even during dual emission.

It is another feature of an embodiment to provide a transparent organic light-emitting display device that can prevent distortion of an image transmitted therethrough by preventing light transmitting therethrough from scattering.

At least one of the above and other features and advantages may be realized by providing an organic light-emitting display device, including a substrate, a plurality of thin film transistors disposed on a first surface of the substrate, a passivation layer covering the plurality of thin film transistors, a plurality of first pixel electrodes disposed on the passivation layer, the first pixel electrodes being electrically connected to the thin film transistors respectively and overlapping the plurality of thin film transistors so as to cover the plurality of thin film transistors, each of the first pixel electrodes including a reflection layer formed of a conductive material that reflects light, a plurality of second pixel electrodes disposed on the passivation layer, the second pixel electrodes being connected to the first pixel electrodes respectively, the second pixel electrodes being formed of a conductive material that transmits light, an opposite electrode, the opposite electrode both allowing light to pass therethrough and reflecting light, the opposite electrode facing the first and second pixel electrodes, and an organic layer disposed among the first and second pixel electrodes and the opposite electrode, the organic layer including an emission layer.

The opposite electrode may include at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

The second pixel electrodes may be formed of at least one metallic oxide, the at least one metallic oxide being ITO, IZO, ZnO, or $In_2O_3$.

The reflection layer may be formed of at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

Each of the second pixel electrodes may include a plurality of conductive patterns that are connected to one another.

Each of the second pixel electrodes may include a plurality of holes.

At least one of the above and other features and advantages may also be realized by providing an organic light-emitting display device, including a substrate, the substrate having a plurality of transmitting regions and a plurality of first pixel regions, the first pixel regions being separated from each other by the transmitting regions interposed therebetween, a plurality of pixel circuit units on a first surface of the substrate, each of the pixel circuits including at least one thin film transistor, the pixel circuit units being disposed in the first pixel regions, respectively, passivation layer covering the plurality of pixel circuit units, the passivation layer extending from the transmission regions to all the first pixel regions, a plurality of first pixel electrodes disposed on the passivation layer, the first pixel electrodes being electrically connected to the pixel circuit units and being disposed in the first pixel regions, respectively, and overlapping the pixel circuit units so as to cover the pixel circuit units, each of the first pixel electrodes including a reflection layer formed of a conductive material that reflects light, a plurality of second pixel electrodes disposed on the passivation layer and being located in the transmitting regions, respectively, the second pixel electrodes being connected to the first pixel electrodes, respectively, the second pixel electrodes being formed of a conductive material that transmits light, an opposite electrode, the opposite electrode both allowing light to pass therethrough and reflecting light, the opposite electrode facing the first and second pixel electrodes, and an organic layer disposed among the first and second pixel electrodes and the opposite electrode, the organic layer including an emission layer.

The opposite electrode may include at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

The second pixel electrodes may be formed of at least one metallic oxide, the at least one metallic oxide being ITO, IZO, ZnO, or $In_2O_3$.

The reflection layer may be formed of at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

The organic light-emitting display device may further include a plurality of conductive lines that are electrically connected to the pixel circuit units, respectively. At least one of the conductive lines may be disposed to overlap with the first pixel electrodes.

The passivation layer may be formed of a transparent material.

The organic light-emitting display device may further include a plurality of second pixel regions, the second pixel regions being disposed in locations corresponding to the second pixel electrodes in at least one part of the transmitting regions, where light is emitted toward the substrate and the opposite electrode in the second pixel regions.

The organic light-emitting display device may further include a plurality of transparent insulating layers, the transparent insulating layers being disposed in locations corresponding to the transmitting regions.

At least one of the transparent insulating layers may include an aperture in a location corresponding to at least one part of the second pixel regions.

Each of the second pixel electrodes may include a plurality of conductive patterns that are connected to one another.

Each of the second pixel electrodes may include a plurality of holes.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
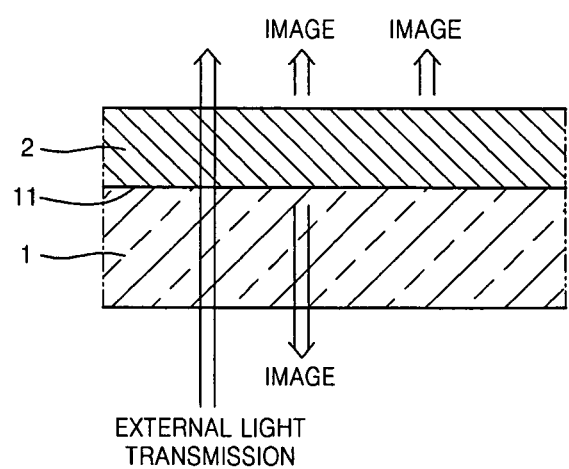
FIG. 1 illustrates a cross-sectional view of an organic light-emitting display device according to an embodiment.

Korean Patent Application No. 10-2010-0020059, filed on Mar. 5, 2010, in the Korean Intellectual Property Office, and entitled: "Organic Light-Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light-emitting display device according to an embodiment.

Referring to FIG. 1, the organic light-emitting display device may include a display unit 2 formed on a first surface 11 of a substrate 1. When external light is incident on the organic light emitting display device, e.g., from the bottom direction in FIG. 1, the external light sequentially penetrates the substrate 1 and the display unit 2.

In the example embodiment shown in FIG. 1, the display unit 2 is a dual emission type, in which an image may be displayed both on upper and lower surfaces thereof, and, as will be described below, the display unit 2 is formed to allow external light to penetrate therethrough. Referring to FIG. 1, the display unit 2 is formed in such a way that a user positioned at a side where an image is displayed, e.g., at the upper side in FIG. 1, can view an image below the substrate 1, e.g., at the lower side in FIG. 1.

Figure 2:
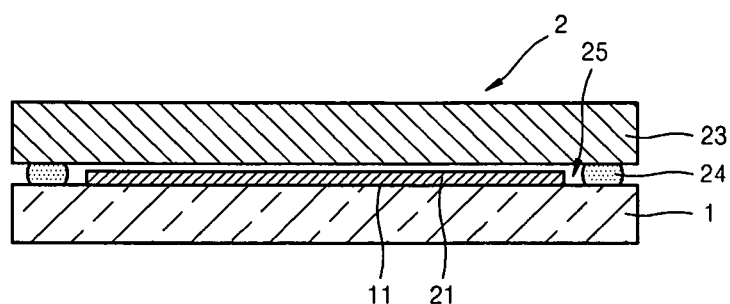
FIG. 2 illustrates a cross-sectional view showing details of the organic light-emitting display device of FIG. 1, according to an embodiment.

FIG. 2 illustrates a cross-sectional view showing details of the organic light-emitting display device of FIG. 1, according to an embodiment. The display unit 2 may include an organic emission unit 21 formed on the first surface 11 of the substrate 1, and may include a sealing substrate 23 for sealing the organic emission unit 21.

The sealing substrate 23 may be formed of a transparent material to allow viewing of an image generated by the organic emission unit 21, and may prevent external air and moisture from penetrating into the organic emission unit 21.

Edges of the sealing substrate 23 and the substrate 1 may be sealed by a sealant 24, thereby sealing a space 25 between the substrate 1 and the sealing substrate 23. The space 25 may be filled with, e.g., a desiccant or a filler.

Figure 3:
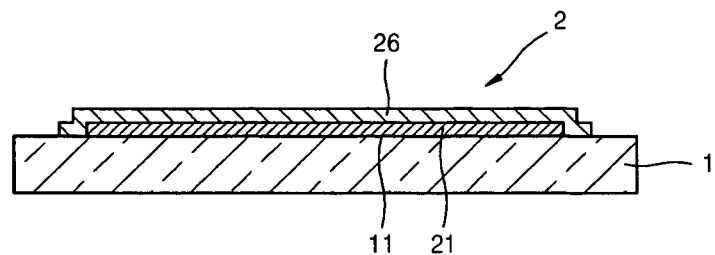
FIG. 3 illustrates a cross-sectional view showing details of the organic light-emitting display device of FIG. 1, according to another embodiment.

FIG. 3 illustrates a cross-sectional view showing details of the organic light-emitting display device of FIG. 1, according to another embodiment. As shown in FIG. 3, a thin sealing film 26 may be formed on the organic emission unit 21 instead of the sealing substrate 23 of FIG. 2 to protect the organic emission unit 21 from external air. The thin sealing film 26 may have a structure in which a film formed of an inorganic material, such as a silicon oxide or a silicon nitride, and a film formed of an organic material, such as epoxy or polyimide, are alternately stacked, but is not limited thereto. For example, the thin sealing film 26 may have any thin film type sealing structure.

Figure 4:
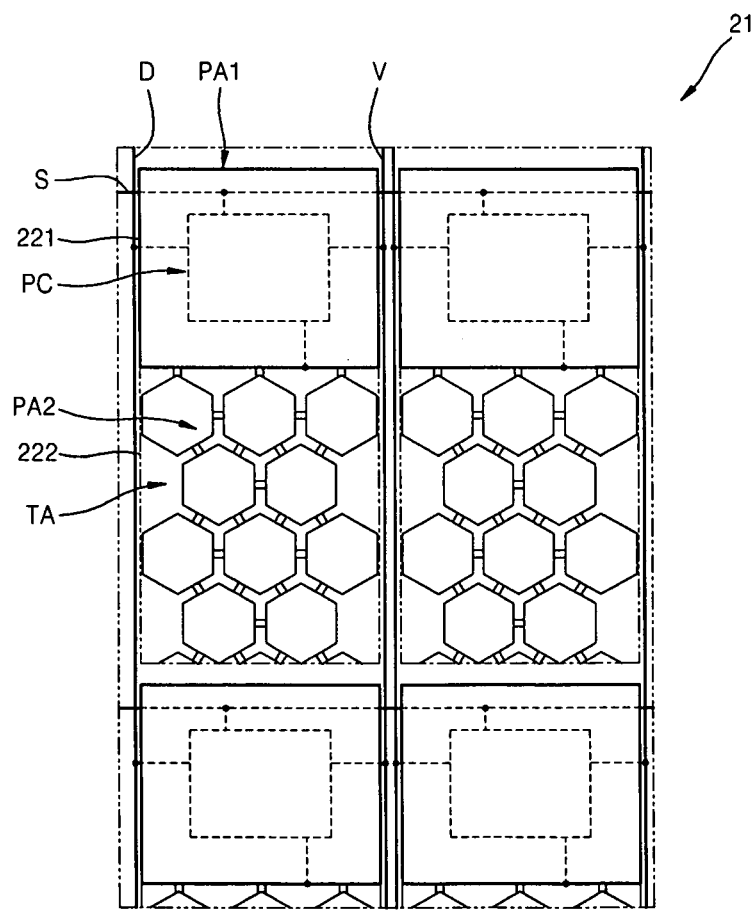
FIG. 4 illustrates a schematic drawing showing an organic emission unit illustrated in FIG. 2 or 3, according to an embodiment.
Figure 5:
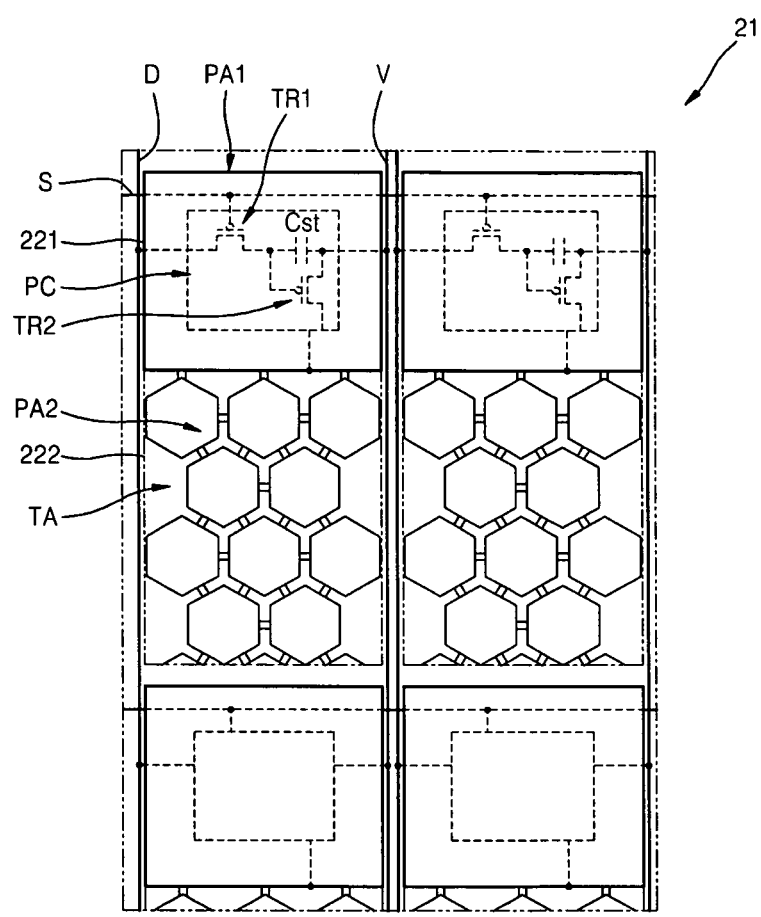
FIG. 5 illustrates a schematic drawing of a plurality of pixel circuit units included in the organic emission unit of FIG. 4, according to an embodiment.

FIG. 4 illustrates a schematic drawing showing an organic emission unit illustrated in FIG. 2 or 3, according to an embodiment. FIG. 5 illustrates a schematic drawing of a plurality of pixel circuit units included in the organic emission unit 21 of FIG. 4, according to an embodiment. Referring to FIGS. 2 through 5, according to an embodiment, the organic emission unit 21 may be formed on the substrate 1. The substrate 1 may have transmitting regions TA for transmitting external light, and first pixel regions PA1 separated from each other and having the transmitting regions TA interposed therebetween. A plurality of second pixel regions PA2 may be located in at least one part of each of the transmitting regions TA to be adjacent to the first pixel regions PA1. In the second pixel regions PA2, both emission of light from the pixels and the transmission of external light can occur.

Referring to FIG. 4, each of the first pixel regions PA1 may include a pixel circuit unit PC and a plurality of conductive lines, such as a scan line S, a data line D, and a Vdd line V, that are electrically connected to the pixel circuit unit PC.

Although not shown, various other conductive lines besides the scan line S, the data line D, and the Vdd line V may further be connected to the pixel circuit unit PC according to the configuration of the pixel circuit unit PC.

Referring to FIG. 5, the pixel circuit unit PC may include a first thin film transistor (TFT) TR1 connected to the scan line S and the data line D, a second TFT TR2 connected to the first TFT TR1 and the Vdd line V, and a capacitor Cst connected to the first and second TFTs TR1 and TR2. The first TFT TR1 may be a switching transistor and the second TFT TR2 may be a driving transistor. The second TFT TR2 may be electrically connected to a first pixel electrode 221. In FIG. 5, the first and second TFTs TR1 and TR2 are shown as P-type transistors, but embodiments are not limited thereto. For example, at least one of the first and second TFTs TR1 and TR2 may be an N-type transistor. Further, embodiments are not limited to the first and second TFTs TR1 and TR2 and the capacitor Cst. For example, more than two TFTs and more than one capacitor may be included in the pixel circuit unit PC according to the configuration of the pixel circuit unit PC.

The scan line S, the data line D, and the Vdd line V may overlap with the first pixel electrode 221, but embodiments are not limited thereto. For example, one or more of the conductive lines including the scan line S, the data line D, and the Vdd line V may be disposed to overlap with the first pixel electrode 221, or all of the conductive lines including the scan line S, the data line D, and the Vdd line V may be disposed adjacent to the first pixel electrode 221.

In the present embodiment, each of the first pixel regions PA1 is a top emission region of a sub pixel for improving an outcoupling efficiency, as will be described below in detail. The pixel circuit unit PC may be located in each of the top emission regions. A user may see through the display device via the transmitting regions TA that include the second pixel regions PA2. Thus, since conductive patterns of the pixel circuit unit PC, which may reduce the transmittance of light, may be located outside the transmitting region TA, the transmittance of the transmitting region TA may be improved.

As described above, according to an embodiment, each of the pixels of the organic emission unit 21 may be divided into the first pixel regions PA1 and the transmitting regions TA, and most of conductive patterns, which may reduce the overall transmittance of a display device, may be located in the first pixel regions PA1, thereby improving the transmittance of the transmitting regions TA. Accordingly, the transmittance of the whole region in which an image is realized (the organic emission unit 21 of FIG. 2 or 3) may be higher than in a conventional transparent display device.

Also, the pixel circuit units PC may be disposed to overlap with the first pixel regions PA1. Thus, it may be possible to prevent external image distortion caused by scattering of external light due to the conductive patterns of devices in the pixel circuit units PC.

Where the conductive lines including the scan line S, the data line D, and the Vdd line V are disposed to cross the transmitting region TA between the adjacent first pixel regions PA1, the conductive lines may be very thin. Thus, the conductive lines may be hard to observe by a user and may have little effect on the overall transmittance of the organic emission unit 21. Accordingly, a transparent display device may be realized. Also, the first pixel regions PA1 may be arranged like dots regularly arranged on a surface of a transparent glass. Thus, even if the user cannot see an external image as clearly in regions covered by the first pixel regions PA1, in consideration of the overall display region, there may nonetheless be little effect on observing the external image.

Each of the first pixel regions PA1 may have the first pixel electrode 221 electrically connected to the pixel circuit unit PC. The pixel circuit unit PC may overlap with the first pixel electrode 221 so that the pixel circuit unit PC may be covered by the pixel electrode 221. Also, at least one of the conductive lines including the scan line S, the data line D, and the Vdd line V may be disposed to cross the first pixel electrode 221. The conductive lines may reduce the transmittance of light less than the pixel circuit unit PC does. Thus, all the conductive lines may be disposed adjacent to the first pixel electrode 221 according to design conditions. As will be described below in detail, the first pixel electrode 221 may include a reflection layer formed of conductive metal that reflects light. Thus, the first pixel electrode 221 may cover the pixel circuit unit PC overlapping with the first pixel electrode 221 and prevent external image distortion caused by the pixel circuit unit PC in the first pixel region PA1.

In each of the transmitting regions TA, a second pixel electrode 222 may be further disposed to form the second pixel region PA2. As will be described below in detail, the second pixel electrode 222 may be formed of a metal oxide for transmitting light so that the second pixel region PA2 may allow light to pass therethrough. The second pixel electrode 222 may have a patterned structure so as to improve the transmittance of light therethrough. This will be described below in detail.

Figure 6:
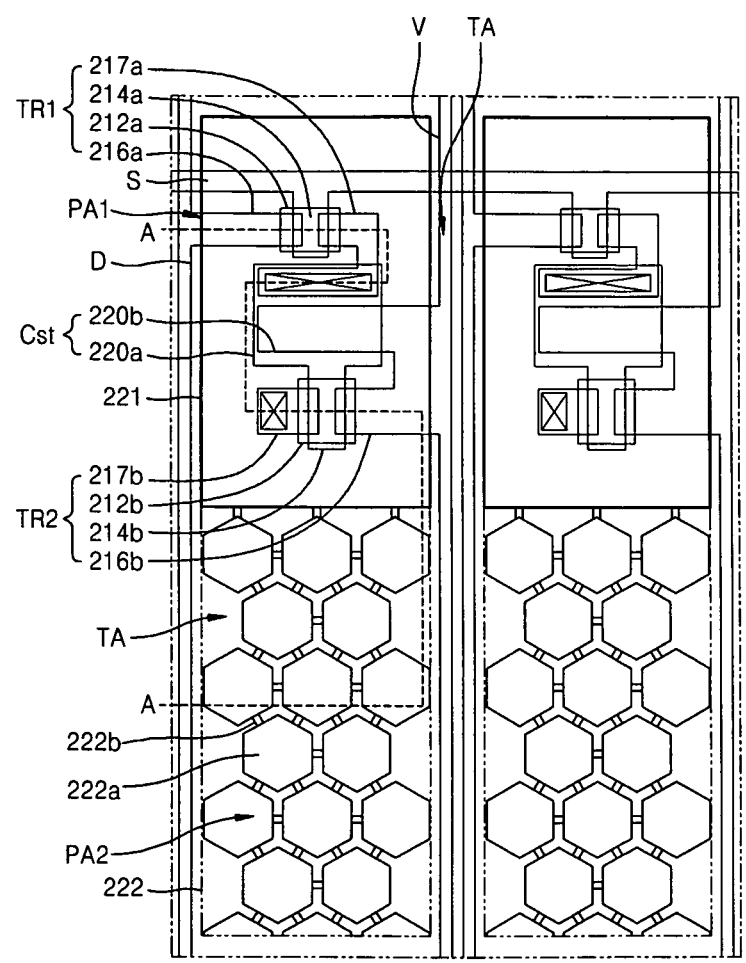
FIG. 6 illustrates a plan view specifically showing the organic emission unit of FIG. 5, according to an embodiment.
Figure 7:
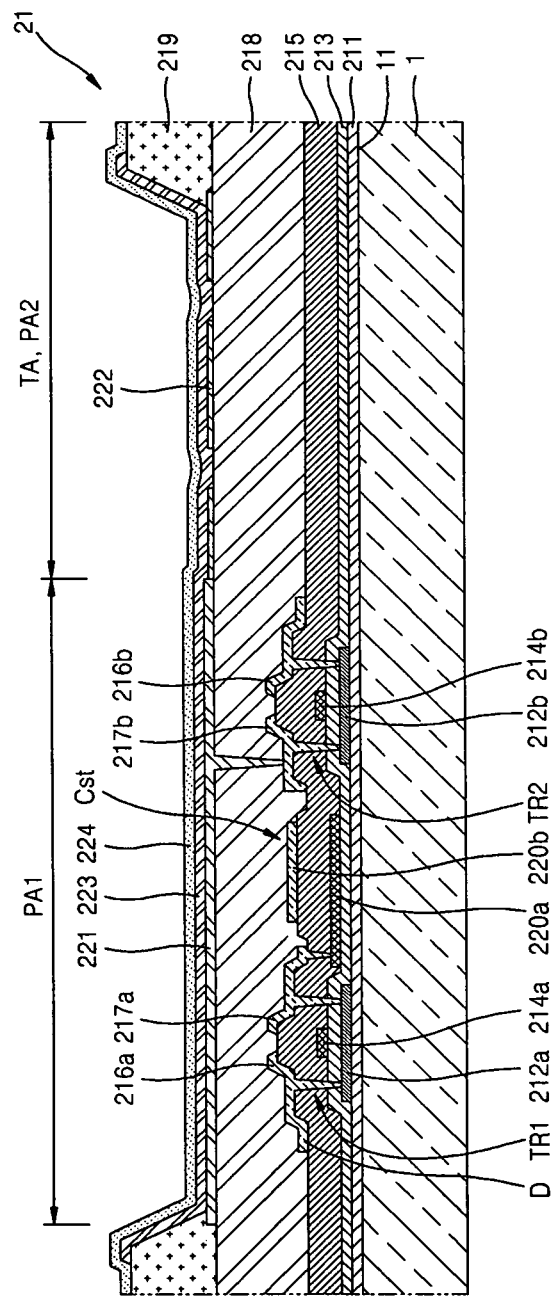
FIG. 7 illustrates a cross-sectional view taken along a line A-A of FIG. 6.

FIG. 6 illustrates a plan view specifically showing the organic emission unit 21 of FIG. 5, according to an embodiment. In FIG. 6, the pixel circuit unit PC of FIG. 5 is illustrated in detail. FIG. 7 illustrates a cross-sectional view taken along a line A-A of FIG. 6.

Referring to FIGS. 6 and 7, a buffer layer 211 may be formed on the first surface 11 of the substrate 1. The buffer layer 211 may prevent impurity elements from penetrating into the organic emission unit 21 and may planarize a surface of the substrate 1. The buffer layer 211 may be formed of any of various materials that can perform the functions described above. For example, the buffer layer 21 may be formed of an inorganic material, such as a silicon oxide, a silicon nitride, a silicon oxynitride, an aluminum oxide, an aluminum nitride, a titanium oxide, or a titanium nitride, an organic material, such as polyimide, polyester, or acryl, or stacks of these materials. In another implementation, the buffer layer 211 may be omitted.

The first TFT TR1, the capacitor Cst, and the second TFT TR2 may be formed on the buffer layer 211. In detail, a first semiconductor active layer 212a and a second semiconductor active layer 212b may be formed on the buffer layer 211. The first and second semiconductor active layers 212a and 212b may be formed of polycrystalline silicon, but are not limited thereto. For example, they may be formed of a semiconductor oxide. In an implementation, the first and second semiconductor active layers 212a and 212b may each be a G—I—Z—O layer [$(In_2O_3)_a(Ga_2O_3)_b(ZnO)_c$ layer], where a, b, and c are integers that respectively satisfy $a \geq 0$, $b \geq 0$, and $c > 0$.

A gate insulating layer 213 may be formed on the buffer layer 211 to cover the first and second semiconductor active layers 212a and 212b. First and second gate electrodes 214a and 214b may be formed on the gate insulating layer 213.

An interlayer insulating layer 215 may be formed on the gate insulating layer 213 to cover the first and second gate electrodes 214a and 214b. A first source electrode 216a, a first drain electrode 217a, a second source electrode 216b, and a second drain electrode 217b may each be formed on the interlayer insulating layer 215, and may be connected to the first semiconductor active layer 212*a* and the second semiconductor active layer 212*b* through contact holes, respectively.

The scan line S may be formed simultaneously with the first and second gate electrodes 214*a* and 214*b*. The data line D may be formed simultaneously with the first source electrode 216*a* to be connected to the first source electrode 216*a*. The Vdd line V may be formed simultaneously with the second source electrode 216*b* to be connected to the second source electrode 216*b*.

In forming the capacitor Cst, a lower electrode 220*a* may be simultaneously formed with the first and second gate electrodes 214*a* and 214*b*, and an upper electrode 220*b* may be simultaneously formed with the first drain electrode 217*a*.

The structures of the first TFT TR1, the capacitor Cst, and the second TFT TR2 are not limited to the above, and any of various types of TFT and capacitor structures may be employed. For example, each of the first and second TFTs TR1 and TR2 may have a top gate structure as described above, or a bottom gate structure in which the first and second gate electrodes 214*a* and 214*b* are located below the first and second semiconductor active layers 212*a* and 212*b*, respectively. However, any other TFT structure may be employed.

A passivation layer 218 may be formed to cover the first TFT TR1, the capacitor Cst, and the second TFT TR2. The passivation layer 218 may be a single layer or multiple layers of insulating layer, an upper surface of which is planarized. The passivation layer 218 may be formed of an inorganic material and/or an organic material.

Referring to FIGS. 6 and 7, a plurality of the first pixel electrodes 221 may be formed on the passivation layer 218 to cover the first TFT TR1, the capacitor Cst, and the second TFT TR2. Each of the first pixel electrodes 221 may be connected to the second drain electrode 217*b* of the second TFT TR2 through a via hole formed in the passivation layer 218.

A plurality of the second pixel electrodes 222 may be formed on the passivation layer 218 to be adjacent to the first pixel electrodes 221, respectively. Each of the first pixel electrodes 221 may be combined with a corresponding second pixel electrode 222. Referring to FIG. 6, the combinations of the first and second pixel electrodes 221 and 222 may be disposed in an island pattern to be independent from each other in units of pixels.

A pixel defining layer 219 may be formed on the passivation layer 218 to cover edges of the first and second pixel electrodes 221 and 222. An organic layer 223 and an opposite electrode 224 may be sequentially formed on the first and second pixel electrode 221 and 222. The opposite electrode 224 may be formed on all the first and second pixel regions PA1 and PA2, and on the transmitting regions TA.

The organic layer 223 may be a low molecular weight organic layer or a polymer organic layer. If the organic layer 223 is a low molecular weight organic layer, then the organic layer 223 may be formed by, e.g., stacking a hole injection layer (HIL), a hole transport layer (HTL), an emission layer (EML), an electron transport layer (ETL), and an electron injection layer (EIL) in a single structure or a composite structure. In this case, the organic layer 223 may be formed of any of various materials, such as copper phthalocyanine (CuPc), N,N'-di(naphthalene-1-yl)-N,N'-diphenyl-benzidine (NPB), or tris-8-hydroxyquinoline aluminum (Alq3). The low-molecular weight organic layer may be formed by vacuum deposition. In this case, the EML may be formed independently for each of red, green, and blue pixels, and the HIL, the HTL, the ETL, and the EIL may be common layers to be commonly applied to the red, green, and blue pixels.

Accordingly, as illustrated in FIG. 7, the common layers may be formed to cover all the first and second pixel regions PA1 and PA2 and the transmitting regions TA, similar to the opposite electrode 224.

The first and second pixel electrodes 221 and 222 may function as anodes and the opposite electrode 224 may function as a cathode. In another implementation, the polarities of the first and second pixel electrodes 221 and 222 and the opposite electrode 224 may be reversed.

The first pixel electrode 221 may have a size corresponding to that of the first pixel region PA1 for each of the red, green, and blue pixels. The second pixel electrode 222 may have a size corresponding to that of the second pixel region PA2 for each of the red, green, and blue pixels, but is not limited thereto. For example, the size of the second pixel electrode 222 may be smaller than that of the second pixel region PA2 for each of the red, green, and blue pixels.

The opposite electrode 224 may be formed as a common electrode covering all pixels of the organic emission unit 21.

The first pixel region PA1 may be a top emission type, in which light is emitted toward the opposite electrode 224. The first pixel electrode 221 may be an electrode that includes a reflection layer, and the opposite electrode 224 may be a semi-transparent and semi-reflection electrode. The first pixel electrode 221 may include a reflection layer formed of, e.g., silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), a compound of these materials, and/or an oxide having a relatively high work function, such as ITO, IZO, ZnO, or $In_2O_3$.

If the first pixel electrode 221 is a reflection electrode, then the pixel circuit unit PC disposed under the first pixel electrode 221 may be covered by the first pixel electrode 221 such that, referring to FIG. 7, at upper outer sides of the opposite electrode 224, a user cannot observe the patterns of the first TFT TR1, the capacitor Cst, and the second TFT TR2 disposed under the first pixel electrode 221. Also, if the pixel electrode 221 is a reflection electrode, then light may be emitted only toward the user, thereby reducing an amount of light lost in a direction opposite to the user. Also, the first pixel electrode 221 may cover various patterns on the pixel circuit unit PC disposed under the first pixel electrode 221. Thus, the user may view a clear image.

The second pixel electrode 222 may be a transparent electrode, which may be formed of, e.g., an oxide having a relatively high work function, such as ITO, IZO, ZnO, or $In_2O_3$. If the second pixel electrode 222 is transparent, at the upper outer sides of the opposite electrode 224, the user may view an image formed below the substrate 1 via the second pixel region PA2.

The second pixel electrode 222 may be formed simultaneously with a process used to form the first pixel electrode 221. For example, transparent metal oxide layers of the first pixel electrode 221, and not the reflection layer thereof, may be patterned in such a way that the transparent metal oxide layer extends to a location of the second pixel electrode 222.

The opposite electrode 224 may be formed of, e.g., a metal having a relatively low work function, such as Ag, Mg, Al, Pt, Pd, Au, Ni, Nd, Ir, Cr, Li, Ca, or an alloy thereof. The opposite electrode 224 may be formed of a thin layer having a thickness of about 100 Å to about 300 Å so that the transmission thereof may be improved. Although not shown, an additional transparent protective layer may further be formed on the opposite electrode 224.

The passivation layer 218, the gate insulating layer 213, the interlayer insulating layer 215, and the pixel defining layer 219 may be formed of a transparent insulating layer. In this case, the transmittance of the substrate 1 may be less than or equal to the overall transmittance of these insulating layers.

Figure 8:
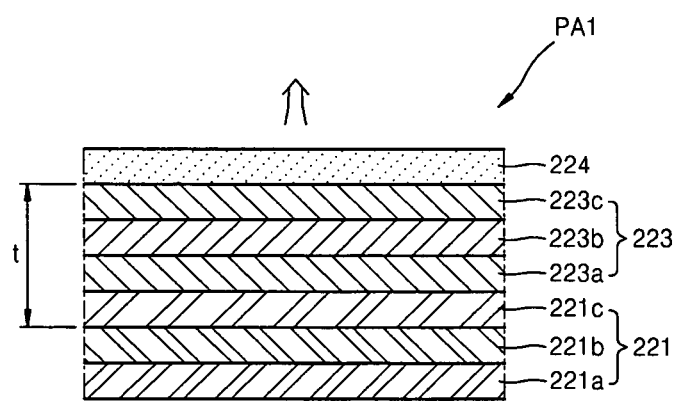
FIG. 8 illustrates a schematic cross-sectional view of a first pixel region illustrated in FIG. 7, according to an embodiment.
Figure 9:
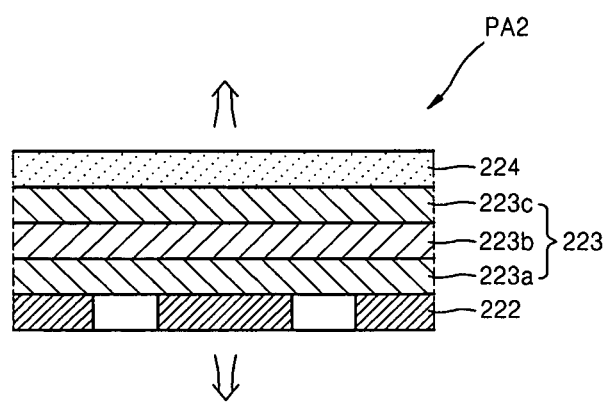
FIG. 9 illustrates a schematic cross-sectional view of a second pixel region illustrated in FIG. 7, according to an embodiment.

FIG. 8 illustrates a schematic cross-sectional view of a first pixel region PA1 illustrated in FIG. 7, according to an embodiment. FIG. 9 illustrates a schematic cross-sectional view of a second pixel region illustrated in FIG. 7, according to an embodiment.

The first pixel electrode 221 may have a structure in which a first transparent conductive layer 221a, a reflection layer 221b, and a second transparent conductive layer 221c are stacked together. The first and second transparent conductive layers 221a and 221c may be formed of, e.g., an oxide having a relatively high work function, such as ITO, IZO, ZnO, or $In_2O_3$. The reflection layer 221b may be formed of, e.g., a metal having a relatively low work function, such as Ag, Mg, Al, Pt, Pd, Au, Ni, Nd, Ir, Cr, Li, Ca, or an alloy thereof.

The organic layer 223 may include, e.g., a stack of a first function layer 223a, an EML 223b, and a second function layer 223c. The organic layer 223 may be formed on the first pixel electrode 221. The opposite electrode 224 may be formed on the organic layer 223. The first function layer 223a may include, e.g., an HIL and a HTL, and the second function layer 223c may include, e.g., an EIL and an ETL.

Referring to FIG. 8, a distance t between a surface of the reflection layer 221b and a surface of the opposite electrode 224 may be controlled in such a way that optical resonance may occur for the wavelength(s) of light emitted from the EML 223b. Thus, the distance t may vary according to a pixel color, i.e., according to whether a current pixel is a red, green, or blue pixel. For the adjustment of the distance t so as to cause optical resonance to occur, an auxiliary layer (not shown) may be formed on the first function layer 223a and/or the second function layer 223 in such a way that the thickness of the auxiliary layer may vary according to the color of pixel.

The first pixel region PA1 may be a top emission type (upward pointing arrow in FIG. 8), in which light is emitted toward the opposite electrode 224. The distance t may be adjusted to cause the optical resonance to occur, thereby maximizing outcoupling efficiency.

As described above, the second pixel electrode 222 may not include a reflection layer, e.g., may be formed of only a transparent conductive material. The second pixel electrode 222 may be formed by, e.g., directly extending at least one of the first and second transparent conductive layers 221a and 221c to a location of the second pixel electrode 222. The organic layer 223, in which the first function layer 223a, the EML 223b, and the second function layer 223c may be stacked, may be formed on the second pixel electrode 222, and the opposite electrode 224 may be formed on the organic layer 223. Where the second pixel electrode 222 in the second pixel region PA2 does not include a reflection layer, optical resonance may not occur and distance adjustment need not be performed.

The second pixel region PA2 may be a dual emission type (upward and downward pointing arrows in FIG. 9), in which an image is formed toward both the opposite electrode 224 and the second pixel electrode 222. The second pixel region PA2 may act as a dual emission region to form an image when the display unit 2 operates, and may act as a transmitting region through which an external image is transmitted when the display unit 2 does not operate.

The second pixel region PA2 may not use optical resonance and thus the outcoupling efficiency of the second pixel region PA2 may be low. Thus, the transmitted external image may appear somewhat dim via the second pixel region PA2 even when the display unit 2 operates. Accordingly, if a user is located above the opposite electrode 224, the user may view not only a clear and bright image having a high outcoupling efficiency via the first pixel region PA1 even when the display unit 2 operates, but also the transmitted external image via the second pixel region PA2. The second pixel electrode 222 may have a patterned structure, and the transmittance of external light may thus be further improved.

Figure 10:
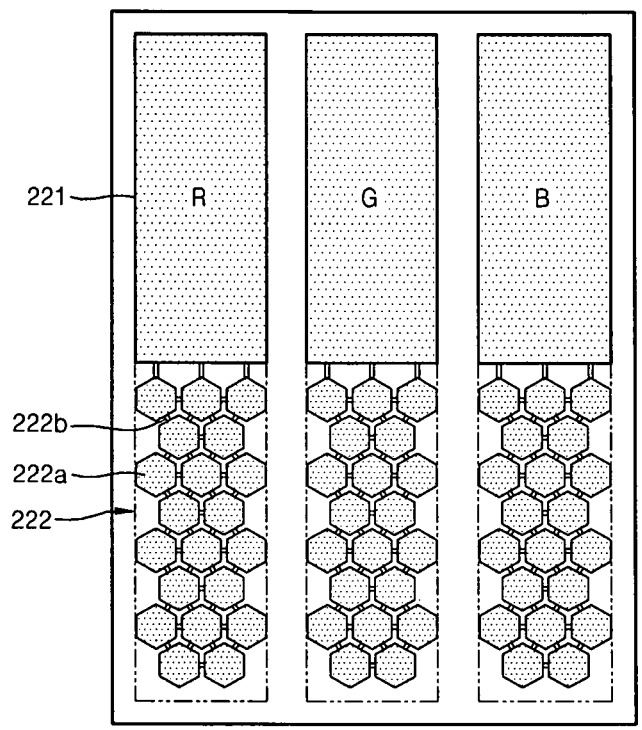
FIG. 10 illustrates a plan view of first pixel electrodes and second pixel electrodes according to an embodiment.

FIG. 10 illustrates a plan view of first pixel electrodes and second pixel electrodes according to an embodiment. Referring to FIG. 10, each of the second pixel electrodes 222 may includes a plurality of hexagonal conductive patterns 222a that are connected to one another via a bridge 222b. The conductive patterns 222a adjacent to one of the first pixel electrodes 221 may be connected to the first pixel electrode 221 via the bridge 222b. However, the shape of the conductive patterns 222a is not limited to a hexagonal shape. For example, the conductive patterns 222a may be formed in a polygonal, circular, or oval shape.

As shown in FIG. 10, if the second pixel electrodes 222 have a pattern as described above, a plurality of the conductive patterns 222a, and a plurality of aperture patterns having no electrode and being between the conductive patterns 222a, may be present in each of the second pixel electrodes 222. The transmittance of external light may be improved and power consumption may be reduced in regions corresponding to the aperture patterns. Referring to FIG. 10, in the second pixel electrode 222, light generated by a small pattern, i.e., each of the conductive patterns 222a, may be diffused via an aperture pattern that is not adjacent to any conductive pattern, thereby improving the efficiency of light emission that occurs toward the substrate 1.

Figure 11:
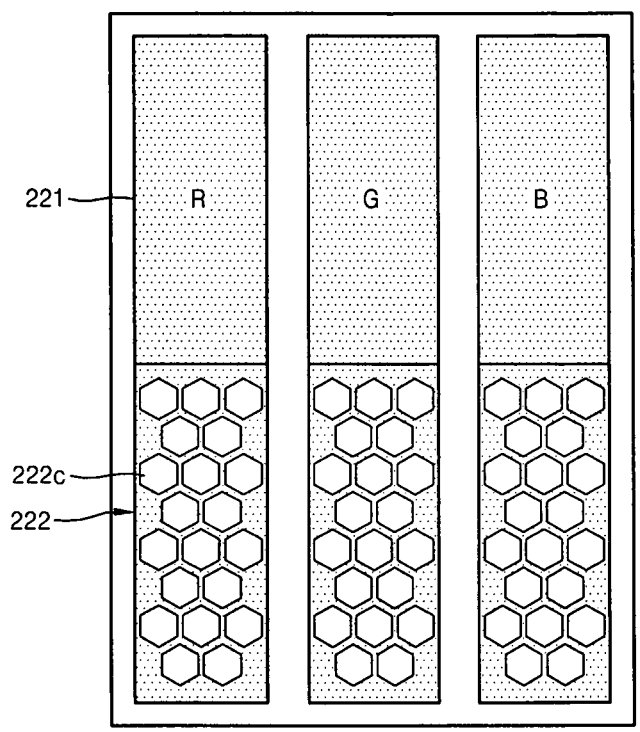
FIG. 11 illustrates a plan view of first pixel electrodes and second pixel electrodes according to another embodiment.

The pattern of the second pixel electrode 222 is not limited by the conductive patterns 222a and the bridges 222b, and the second pixel electrode 222 may be, e.g., a flat plate type electrode having a plurality of holes 222c therein as illustrated in FIG. 11, which illustrates a plan view of first pixel electrodes and second pixel electrodes according to another embodiment.

In this case, light emission occurs in a part of the second pixel electrode 222 except for the holes 222c therein and the transmittance of external light is improved by the holes 222c. Also, the efficiency of light emitted toward the substrate 1 may be improved by using diffusion of light in regions corresponding to the holes 222c.

Figure 12:
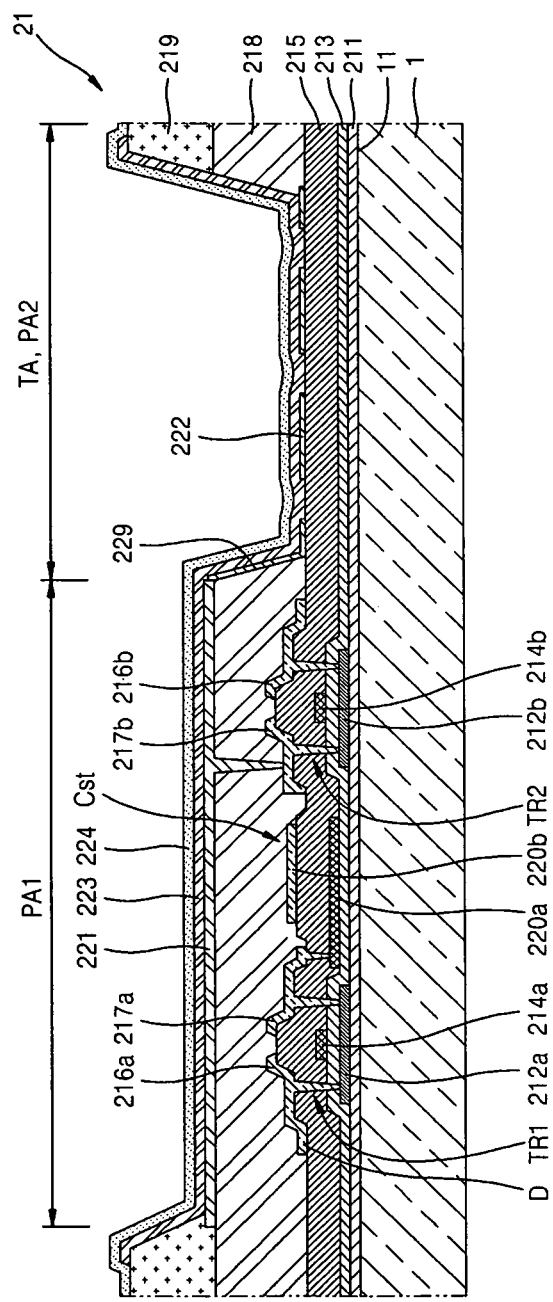
FIG. 12 illustrates a plan view of an organic emission unit according to another embodiment.

FIG. 12 illustrates a plan view of an organic emission unit according to another embodiment. Referring to FIG. 12, an aperture 229 is formed in at least one part of a plurality of insulating layers corresponding to at least one part of a second pixel region PA2 in order to increase the transmittance of external light of a transmitting region TA, to prevent optical interference caused by multilayered transparent insulating layers in the transmitting region TA, and to prevent a degradation in color caused by the optical interference.

In order to increase the transmittance of external light of the transmitting region TA, the transmitting region TA may be widened or the transmitting region TA may be formed of a material having a relatively higher transmittance. However, there may be a restriction in widening the transmitting region TA due to a restriction in design of a pixel circuit unit. Accordingly, the transmitting region TA may be formed of a material having a high transmittance in order to increase the transmittance of external light of the transmitting region TA. However, a number of usable materials having a sufficiently high transmittance may be somewhat limited. Also, as described above, increasing of the transmittance of external light in the transmitting region TA may be limited since the second pixel region PA2 may occupy most of the transmitting region TA. Accordingly, the aperture 229 may be formed in at least one part of the insulating layers corresponding to at least one part of the second pixel region PA2.

Referring to FIG. 12, the aperture 229 may be formed on a passivation layer 218 covering the pixel circuit unit, but embodiments are not limited thereto. For example, in order to improve the transmittance of the aperture 229, the aperture 229 may further include any of other apertures that are formed in at least one from among an interlayer insulating layer 215, a gate insulating layer 213, and a buffer layer 211 to be connected to the first aperture 225. The aperture 229 may be formed as wide as possible without interrupting a scan line S, a data line D, and a Vdd line V.

In a general transparent display device, when the transparent display device is in an off-state, an image from an object positioned on a side of the transparent display device opposite to a user may be transmitted to the user through not only patterns of organic light-emitting devices, thin film transistors, and other conductive lines, but also through the spaces therebetween. However, the transmittances of the organic light-emitting device, the thin film transistor, and the other conductive lines may not be high, and the spaces therebetween may be very small. Thus, the overall transmittance of the general transparent display device may not be high. Also, the transmitted image may appear distorted, caused by the patterns of the organic light-emitting device, the thin film transistor, and the conductive lines. The reason for this is because the gaps between the patterns may only be a few nanometers, which is at a level close to the wavelengths of visible light, and thus, the gaps scatter light therethrough. A general organic light-emitting display device may be advantageous in that a dual (top and bottom) emission type display device can be more easily manufactured than a liquid crystal display device. However, optical resonance cannot be expected since such a general dual emission type display device does not use a reflection anode, thereby lowering an outcoupling efficiency of the general dual emission type display device. Moreover, if a semi-transparent anode is used instead of a transparent anode so as to increase the outcoupling efficiency, then the transparency of the general dual emission type display device reduces.

In contrast, as described above, embodiments may provide a transparent organic light-emitting display device exhibiting increased transmittance of external light and improved outcoupling efficiency even during dual emission. Also, embodiments may provide a transparent organic light-emitting display device in which image distortion is prevented by suppressing dispersion of light transmitted therethrough. In an embodiment, a second pixel electrode may have a pattern in which the transmittance of external light is improved and power consumption is reduced in regions corresponding to aperture patterns. In the second pixel electrode, light generated by a small pattern, i.e., each of the conductive patterns, may be diffused via an aperture pattern that is not adjacent to any conductive pattern, thereby improving the efficiency of light emission that occurs toward the substrate.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light-emitting display device, comprising:
   a substrate;
   a plurality of thin film transistors disposed on a first surface of the substrate;
   a passivation layer covering the plurality of thin film transistors;
   a plurality of first pixel electrodes disposed on the passivation layer, the first pixel electrodes being electrically connected to the thin film transistors respectively and overlapping the plurality of thin film transistors so as to cover the plurality of thin film transistors, each of the first pixel electrodes including a reflection layer formed of a conductive material that reflects light;
   a plurality of second pixel electrodes disposed on the passivation layer, the second pixel electrodes being connected to the first pixel electrodes respectively, the second pixel electrodes being formed of a conductive material that transmits light;
   an opposite electrode, the opposite electrode both allowing light to pass therethrough and reflecting light, the opposite electrode facing the first and second pixel electrodes; and
   an organic layer disposed among the first and second pixel electrodes and the opposite electrode, the organic layer including an emission layer.

2. The organic light-emitting display device as claimed in claim 1, wherein the opposite electrode includes at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

3. The organic light-emitting display device as claimed in claim 1, wherein the second pixel electrodes are formed of at least one metallic oxide, the at least one metallic oxide being ITO, IZO, ZnO, or $In_2O_3$.

4. The organic light-emitting display device as claimed in claim 1, wherein the reflection layer is formed of at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

5. The organic light-emitting display device as claimed in claim 1, wherein each of the second pixel electrodes includes a plurality of conductive patterns that are connected to one another.

6. The organic light-emitting display device as claimed in claim 1, wherein each of the second pixel electrodes includes a plurality of holes.

7. An organic light-emitting display device, comprising:
   a substrate, the substrate having a plurality of transmitting regions and a plurality of first pixel regions, the first pixel regions being separated from each other by the transmitting regions interposed therebetween;
   a plurality of pixel circuit units on a first surface of the substrate, each of the pixel circuits including at least one thin film transistor, the pixel circuit units being disposed in the first pixel regions, respectively;
   a passivation layer covering the plurality of pixel circuit units, the passivation layer extending from the transmission regions to all the first pixel regions;
   a plurality of first pixel electrodes disposed on the passivation layer, the first pixel electrodes being electrically connected to the pixel circuit units and being disposed in the first pixel regions, respectively, and overlapping the pixel circuit units so as to cover the pixel circuit units, each of the first pixel electrodes including a reflection layer formed of a conductive material that reflects light;
   a plurality of second pixel electrodes disposed on the passivation layer and being located in the transmitting regions, respectively, the second pixel electrodes being connected to the first pixel electrodes, respectively, the second pixel electrodes being formed of a conductive material that transmits light;

an opposite electrode, the opposite electrode both allowing light to pass therethrough and reflecting light, the opposite electrode facing the first and second pixel electrodes; and an organic layer disposed among the first and second pixel electrodes and the opposite electrode, the organic layer including an emission layer.

8. The organic light-emitting display device as claimed in claim 7, wherein the opposite electrode includes at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

9. The organic light-emitting display device as claimed in claim 7, wherein the second pixel electrodes are formed of at least one metallic oxide, the at least one metallic oxide being ITO, IZO, ZnO, or $In_2O_3$.

10. The organic light-emitting display device as claimed in claim 7, wherein the reflection layer is formed of at least one metal, the at least one metal being silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

11. The organic light-emitting display device as claimed in claim 7, further comprising a plurality of conductive lines that are electrically connected to the pixel circuit units, respectively, wherein at least one of the conductive lines is disposed to overlap with the first pixel electrodes.

12. The organic light-emitting display device as claimed in claim 7, wherein the passivation layer is formed of a transparent material.

13. The organic light-emitting display device as claimed in claim 7, further comprising a plurality of second pixel regions, the second pixel regions being disposed in locations corresponding to the second pixel electrodes in at least one part of the transmitting regions, where light is emitted toward the substrate and the opposite electrode in the second pixel regions.

14. The organic light-emitting display device as claimed in claim 13, further comprising a plurality of transparent insulating layers, the transparent insulating layers being disposed in locations corresponding to the transmitting regions.

15. The organic light-emitting display device as claimed in claim 14, wherein at least one of the transparent insulating layers includes an aperture in a location corresponding to at least one part of the second pixel regions.

16. The organic light-emitting display device as claimed in claim 7, wherein each of the second pixel electrodes includes a plurality of conductive patterns that are connected to one another.

17. The organic light-emitting display device as claimed in claim 7, wherein each of the second pixel electrodes includes a plurality of holes.

* * * * *